United States Patent
Lee et al.

(10) Patent No.: US 11,146,430 B1
(45) Date of Patent: Oct. 12, 2021

(54) DC-BALANCED, TRANSITION-CONTROLLED, SCALABLE ENCODING METHOD AND APPARATUS FOR MULTI-LEVEL SIGNALING

(71) Applicant: SEOUL NATIONAL UNIVERSITY R&DB FOUNDATION, Seoul (KR)

(72) Inventors: Woonghee Lee, Seoul (KR); Deog-Kyoon Jeong, Seoul (KR)

(73) Assignee: Seoul National University R&DB Foundation, Seoul (KR)

(*) Notice: Subject to any disclaimer, the term of this patent is extended or adjusted under 35 U.S.C. 154(b) by 35 days.

(21) Appl. No.: 16/874,277

(22) Filed: May 14, 2020

(51) Int. Cl.
  *H04L 25/49* (2006.01)
  *H03M 5/14* (2006.01)
  *H04L 25/02* (2006.01)

(52) U.S. Cl.
  CPC ........ *H04L 25/4917* (2013.01); *H03M 5/145* (2013.01); *H04L 25/0272* (2013.01); *H04L 25/4908* (2013.01)

(58) Field of Classification Search
  CPC ............. H04L 25/4917; H04L 25/0272; H04L 25/4908; H03M 5/145
  See application file for complete search history.

(56) References Cited

U.S. PATENT DOCUMENTS

| | | | | |
|---|---|---|---|---|
| 4,309,694 A | * | 1/1982 | Henry | H04L 25/4915 341/58 |
| 4,486,739 A | | 12/1984 | Franaszek et al. | |
| 5,663,724 A | * | 9/1997 | Westby | H03M 5/145 341/106 |
| 6,333,704 B1 | * | 12/2001 | Jung | H03M 5/00 341/58 |
| 2003/0210162 A1 | * | 11/2003 | Shin | H04L 47/245 341/58 |

FOREIGN PATENT DOCUMENTS

EP  1421690 B1  3/2009

OTHER PUBLICATIONS

IEEE Journal of Solid-State Circuits, vol. 38, No. 3, John. T. Stonick, et al., "An Adaptive PAM-4 5-GB/s Backplane Transceiver in 0.25-um CMOS", Mar. 2003.

* cited by examiner

Primary Examiner — Nader Bolourchi
(74) Attorney, Agent, or Firm — Rabin & Berdo, P.C.

(57) ABSTRACT

The present invention relates to an encoding apparatus for multi-level signaling, the encoding apparatus including: a candidate pattern generator (1) generating a set of candidate patterns from input data by using symbol-based inversion; a controller (2) generating a cumulated disparity value that is a result of calculating disparity indicating a degree to which transmission data up to previous transmission deviates from DC balance, storing the cumulated disparity value, and determining a transmission control code by using the cumulated disparity value and a set of disparity values that is a result of calculating disparity indicating a degree to which each of the candidate patterns deviates from DC balance; and a data selector (3) selecting one candidate pattern from the set of the candidate patterns as data to be transmitted, according to the determined transmission control code.

21 Claims, 14 Drawing Sheets

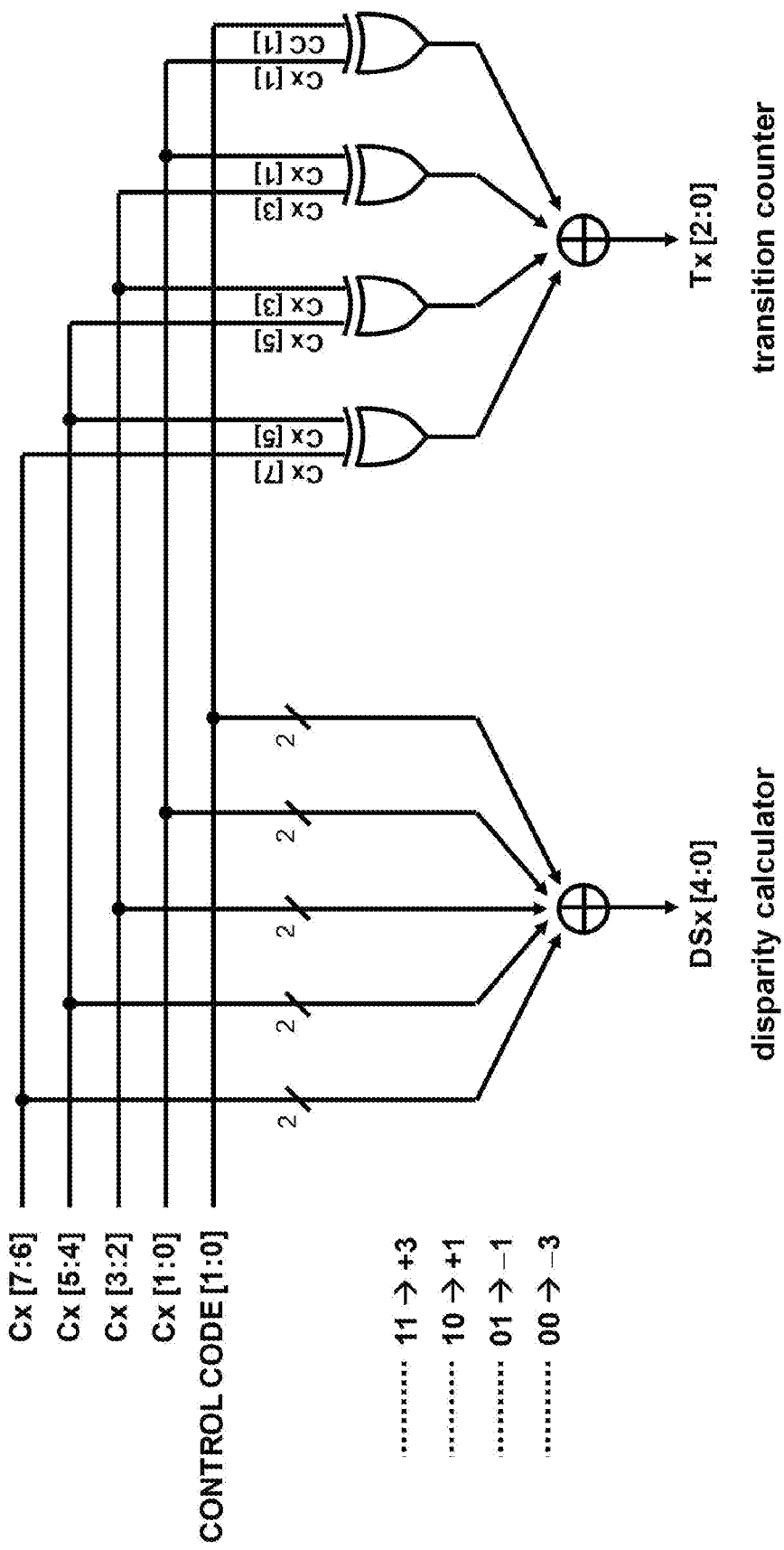

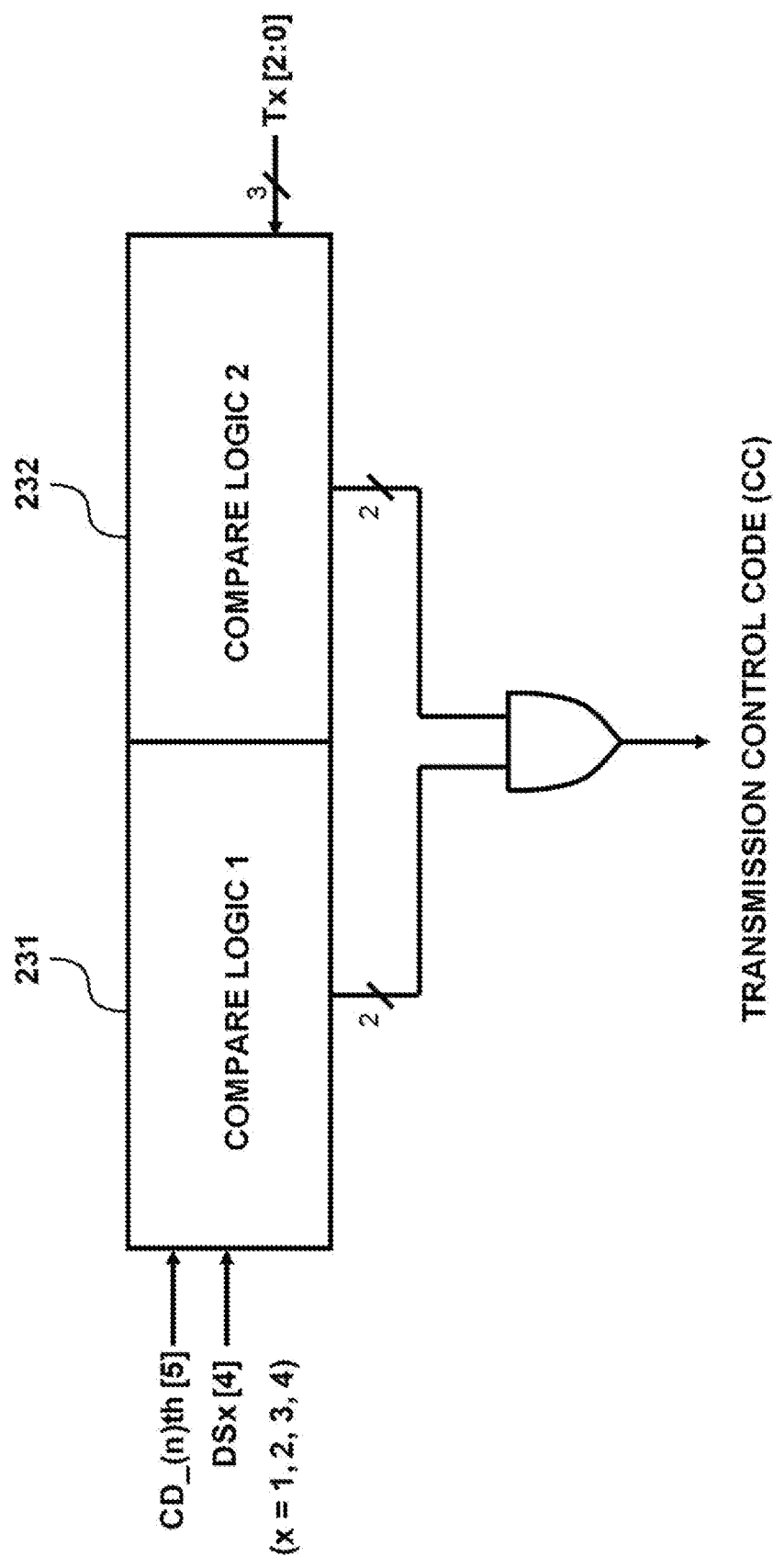

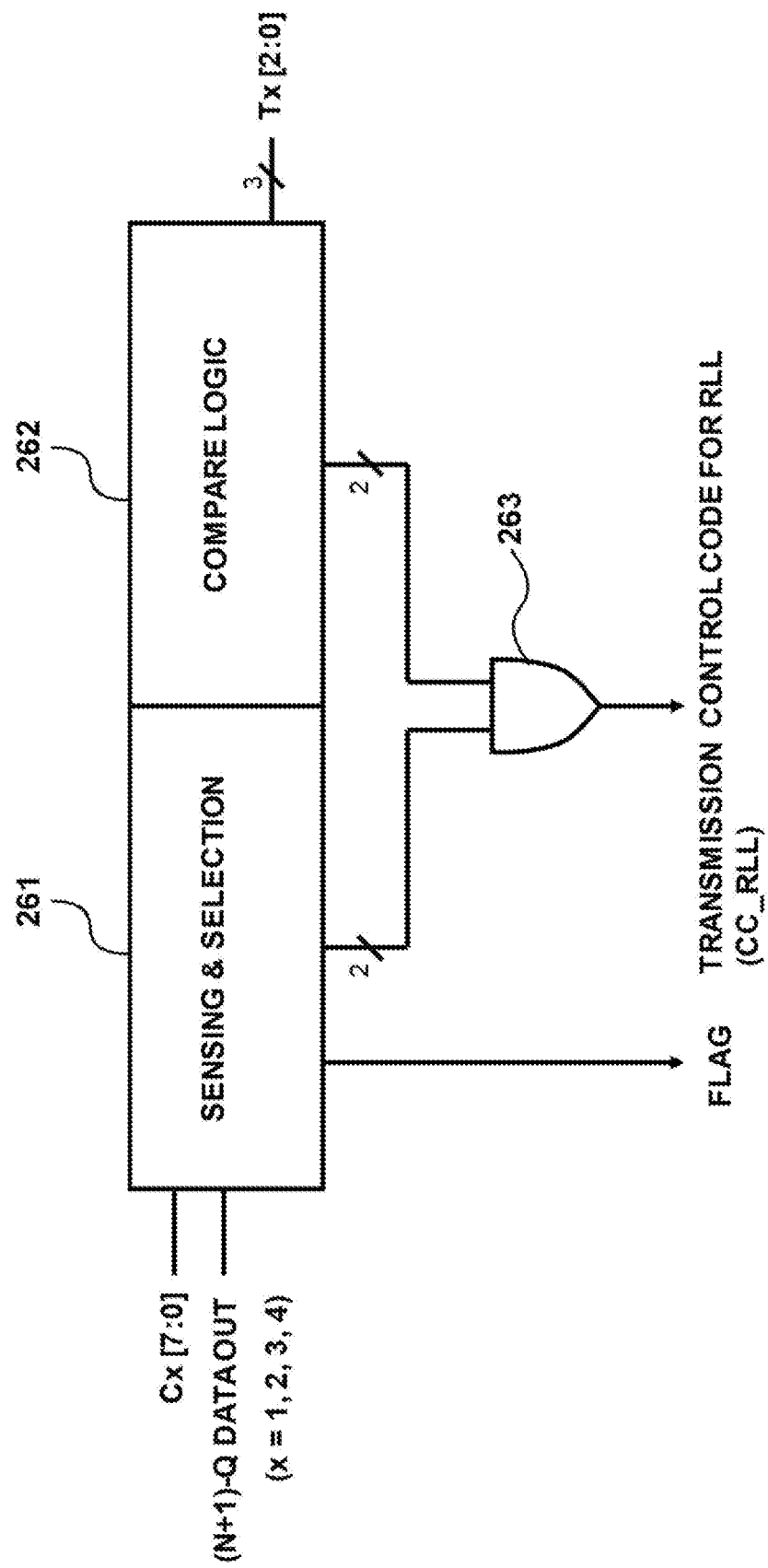

DC-BALANCED, TRANSITION-CONTROLLED, SCALABLE ENCODING METHOD AND APPARATUS FOR MULTI-LEVEL SIGNALING

BACKGROUND OF THE INVENTION

Field of the Invention

The present invention relates to an encoding method and apparatus for multi-level signaling.

Description of the Related Art

In a wireline architecture performing optical or electrical data transmission for Internet networking, an increase in data rate is continuously required. In order to satisfy this requirement, an optical/electrical link design also continues to technologically advance through an increase in an operating speed and the number of pin ports of a system.

On the other hand, compared to the increase rate of the data rate needs required in an application, the improvement in a data transmission medium (channel) is relatively slow. Therefore, deterioration in signal integrity caused by frequency-dependent distortion such as the skin effect, and dielectric loss and reflection has become more and more of a problem. As the channel loss becomes a problem due to high Nyquist frequency, multi-level signaling through pulse-amplitude modulation (PAM) is more efficient than a non-return-to-zero (NRZ) method. Therefore, interest in multi-level signaling such as PAM-4, which generates a 4-level 1-symbol on a per-2-bit basis, and applications introducing this have increased.

In the meantime, the wireline architecture often requires AC coupling in some cases, such as independently setting the supply level of a transmitter and a receiver, and so on. In the case of the NRZ, when the number of 1's and the number of 0's are not balanced, deterioration in signal integrity caused by drift of the DC level may occur. Therefore, a method of performing DC balancing through a balancing code is used, for example, 8-B/10-B. [Ref. 1: U.S. Pat. No. 4,486,739 P. A. Franaszek, Albert X. Widmer, "BYTE ORIENTED DC BALANCED (0,4) 8B/10B PARTITIONED BLOCK TRANSMISSION CODE", December 1984]

FIGS. 1A and 1B are block diagrams of a transmitter chip that performs DC balancing for multi-level signaling such as PAM-4. First, in the case of PAM-4, DC levels are represented by allocating 2-bit inputs, for example, 11→+3, 10→+1, 01→−1, 00→−3. Herein, the following equation needs to be satisfied for DC balancing.

$$(+3) \times a + (+1) \times b + (-1) \times c + (-3) \times d = 0 \quad \text{(Eq. 1)}$$

Herein, a, b, c, and d are count values of the symbols which correspond to +3, +1, −1, and −3, respectively, in an input data sequence.

FIG. 1A is a block diagram showing a case where an 8-B/10-B encoder is used in PAM-4 DC balancing. The 8-B/10-B encoder receives a byte-based input sequence, and outputs a 10-B output pattern according to a sequence conversion table. However, the format in which one 8-B/10-B encoder output is divided on a per-5-B basis and the results of division are allocated to the MSB and the LSB of PAM-4, respectively, does not satisfy the requirement Eq. 1 of PAM-4 DC balancing. Therefore, as shown in FIG. 1A, PAM-4 DC balancing may be implemented by using a method of applying an 8-B/10-B encoder to each of the MSB and the LSB. However, when PAM-4 DC balancing based on the 8-B/10-B encoder is implemented, coding overhead of 25% occurs and the load is imposed on the data bandwidth. In addition, to reduce the coding overhead, an input sequence corresponding to the longer data length needs to be received and a minimum additional bit needs to be added. However, there is also a constraint that the 8-B/10-B encoder is impossible to be applied to the data length other than that corresponding to Byte×2 (16-B).

FIG. 1B is a block diagram showing an example of a case where unlike the 8-B/10-B, PAM-4 encoding is performed on a per-symbol basis rather than a per-bit (B) basis. The 8-B/5-Q encoder in Ref. 2 (& Ref. 3) uses a method of mapping an 8-B input data sequence to a DC-balanced quaternary symbol (Q) and simultaneously controlling a transition to change the spectrum shape of the output signal. [Ref. 2: European Patent 1 421 690, John. T. Stonick, et al., "METHOD AND APPARATUS FOR ENCODING AND DECODING DIGITAL COMMUNICATIONS DATA", August 2002.] [Ref. 3: IEEE Journal of Solid-State Circuits, Vol. 38, No. 3, John. T. Stonick, et al., "An Adaptive PAM-4 5-Gb/s Backplane Transceiver in 0.25-um CMOS", March 2003.]

Specifically, it is advantageous that by performing mapping that eliminates the highest slew-rate transition (e.g. from −3 to +3), the upper/lower eye characteristic is more widely opened in a PAM-4 eye diagram. However, due to the nature of mapping based on a look-up table, in the same manner as the 8-B/10-B encoder, application to an data input corresponding to the data length other than Byte (8-B) is impossible, and coding overhead of 25% occurs. In addition, for a clock and data recovery (CDR) circuit of the receiver, instead of eliminating the high slew rate transition, which is the most advantageous, two sampler circuits for using information of a middle transition (e.g. from −3 to +1) are added, so that the load of the equalizer is increased. This may be disadvantageous to increase the data rate.

The foregoing is intended merely to aid in the understanding of the background of the present invention, and is not intended to mean that the present invention falls within the purview of the related art that is already known to those skilled in the art.

SUMMARY OF THE INVENTION

The present invention is intended to provide an encoding apparatus and an encoding method that have the degree of freedom in an input data length in performing DC balancing.

In addition, the present invention is intended to provide an encoding apparatus and an encoding method that are capable of remarkably reducing coding overhead for DC balancing as an input data length increases.

According to one aspect of the present invention, there is provided an encoding apparatus for multi-level signaling, the encoding apparatus including: a candidate pattern generator (1) generating a set of candidate patterns from input data by using symbol-based inversion; a controller (2) generating a cumulated disparity value that is a result of calculating disparity indicating a degree to which transmission data up to previous transmission deviates from DC balance, storing the cumulated disparity value, and determining a transmission control code by using the cumulated disparity value and a set of disparity values that is a result of calculating disparity indicating a degree to which each of the candidate patterns deviates from DC balance; and a data selector (3) selecting one candidate pattern from the set of the candidate patterns as data to be transmitted, according to the determined transmission control code.

In the encoding apparatus for multi-level signaling, the controller (2) may include: a disparity calculator (22) outputting the set of the disparity values that is the result of calculating disparity indicating the degree to which each of the candidate patterns deviates from DC balance; and a transition counter (21) outputting, as a set of transition counts, a result of calculating the number of times that a symbol-based transition is performed, for each of the candidate patterns.

In the encoding apparatus for multi-level signaling, the controller (2) may further include a control code decision logic (23) determining the transmission control code by using the set of the transition counts and a result of comparing the set of the disparity values with the cumulated disparity value.

According to another aspect of the present invention, there is provided an encoding method for multi-level signaling, the encoding method including: generating, at a first step, a set of candidate patterns from input data by using symbol-based inversion; determining, at a second step, a transmission control code by using a cumulated disparity value previously stored and a set of disparity values that is a result of calculating disparity indicating a degree to which each of the candidate patterns deviates from DC balance; and selecting, at a third step, one candidate pattern from the set of the candidate patterns as data to be transmitted, according to the determined transmission control code, wherein the cumulated disparity value is a result of accumulating disparity indicating a degree to which transmission data up to previous transmission deviates from DC balance.

According to still another aspect of the present invention, there is provided an encoding method for multi-level signaling, the encoding method including: generating, from input data, a set of candidate patterns including a first pattern obtained by not inverting the input data at all, a second pattern obtained by partially inverting the input data, a third pattern obtained by partially inverting the input data, the third pattern being in a complementary relationship with the second pattern, and a fourth pattern obtained by inverting all the input data; and selecting one pattern among the first pattern to the fourth pattern as data to be transmitted, by using a cumulated disparity value previously stored and a set of disparity values that is a result of calculating disparity indicating a degree to which each of the first pattern to the fourth pattern deviates from DC balance, wherein the cumulated disparity value is a result of accumulating disparity indicating a degree to which transmission data up to previous transmission deviates from DC balance.

According to the present invention, a DC balance characteristic is guaranteed because the output data pattern is selected among the candidate patterns by referring to the cumulated disparity value so that DC balance is achieved.

In addition, as there is more zero-crossing transition, the CDR circuit of the receiver is capable of more accurately and rapidly recovering a data sampling clock phase. According to the present invention, DC balance is guaranteed while transitions are maximized.

In addition, the present invention has a scalability characteristic in that it is applicable to input data having an arbitrary 2N-B (N is a natural number of 2 or more) length. Table 1 shows coding overhead according to the value of N in a 2N-B/(N+1)-Q encoder. As shown in Table 1, in the case of N=4, it becomes an 8-B/5-Q encoder that has the coding overhead of 25%, which is the same as that of the conventional 8-B/10-B. In the case of values of N>4, the coding overhead is remarkably reduced.

TABLE 1

| N | INPUT 2N − B | OUTPUT (N + 1) − Q | Coding overhead |
|---|---|---|---|
| 2 | 4 | 3 | 50% |
| 3 | 6 | 4 | 33.3% |
| 4 | 8 | 5 | 25% |
| 5 | 10 | 6 | 20% |
| 6 | 12 | 7 | 16.7% |
| 7 | 14 | 8 | 14.3% |

In addition, the present invention consists of only a combinational logic calculating each disparity and transition after forming the candidate patterns with inversion depending on the symbol location, and a final data pattern selector, so that simple and compact implementation is possible.

BRIEF DESCRIPTION OF THE DRAWINGS

The above and other objectives, features, and other advantages of the present invention will be more clearly understood from the following detailed description when taken in conjunction with the accompanying drawings, in which:

FIGS. 5A to 5C are conceptual diagrams of a disparity calculator and a transition counter;

FIG. 7 is a conceptual diagram of a control code decision logic;

FIGS. 9A to 9C are diagrams showing another embodiment of an encoder with run-length limit (RLL) encoding.

DETAILED DESCRIPTION OF THE INVENTION

The present invention relates to an encoding method and apparatus, wherein a data sequence having an arbitrary length is used as an input and an output symbol having a DC-balanced characteristic in addition to a transition-controlled characteristic is generated. The encoding method may be executed in a transmitter, and the encoding apparatus may be included in the transmitter. A decoding method in a dual relationship with the encoding method according to the present invention may be executed in a receiver, and a decoding apparatus in a dual relationship with the encoding apparatus may be included in the receiver.

Although the scope of the present invention is not limited to PAM-4, for clear description, PAM-4 among types of multi-level signaling will be described below as an example.

Figure 1A:
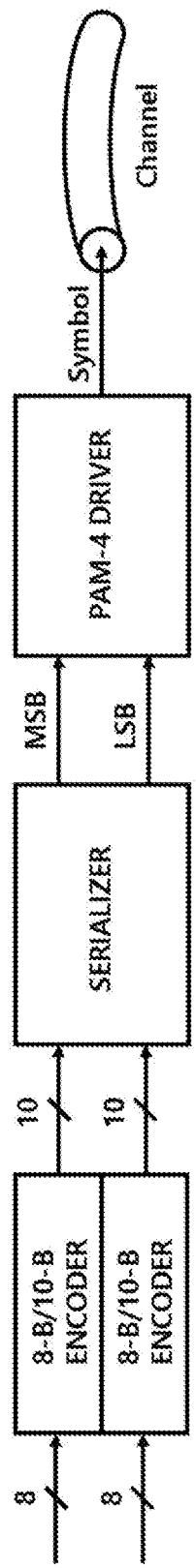
FIGS. 1A and 1B are block diagrams (prior art) of a transmitter chip that performs DC balancing of multi-level signaling (PAM-4)
Figure 1B:
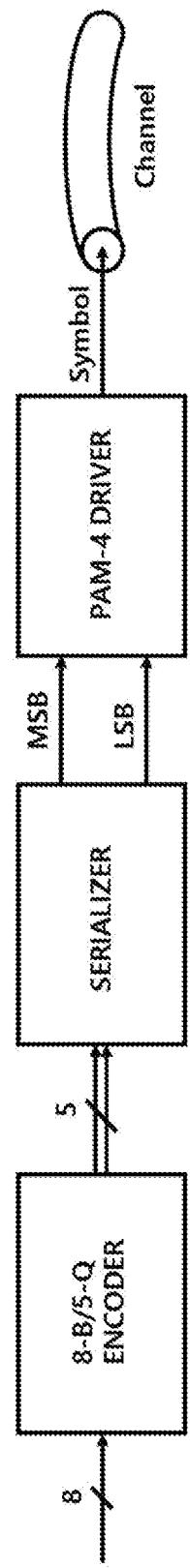
Figure 2:
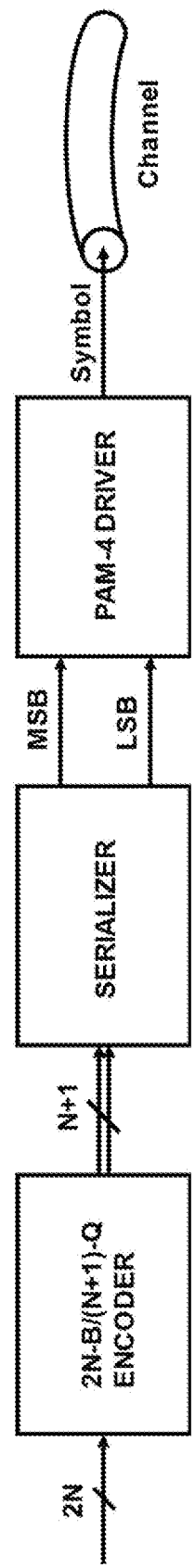
FIG. 2 is a block diagram of a transmitter chip that performs PAM-4 DC balancing according to an embodiment of the present invention.

FIG. 2 is a block diagram of a transmitter chip that performs PAM-4 DC balancing according to an embodiment of the present invention. In PAM-4 signaling, conversion into a 1-Q symbol is performed on a per-2-bit basis. Therefore, a 2N-B/(N+1)-Q encoder receives an input having an arbitrary 2N data length (N is a natural number of 2 or more), generates N Q-symbols, and adds only one Q-symbol having information on an in/out relationship, to the generated N Q-symbols, thereby outputting N+1 symbols. According to the present invention, transmission data having (N+1) Q-symbols is output from input data having arbitrary 2N bits (N is a natural number of 2 or more).

Figure 3:
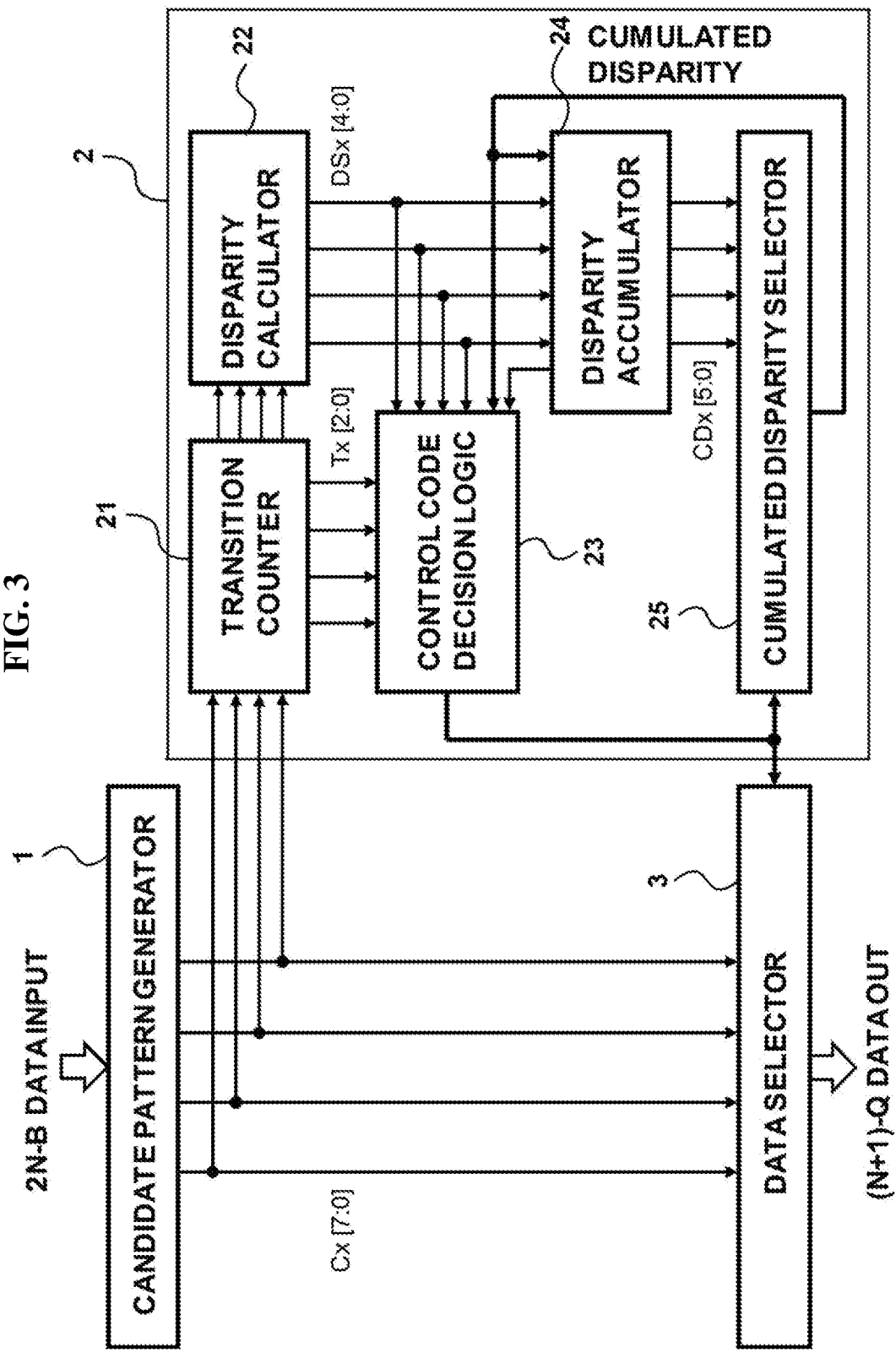
FIG. 3 is a block diagram showing a functional configuration of an encoding apparatus, specifically, a 2N-B/(N+1)-Q encoder, for multi-level signaling according to an embodiment of the present invention.

FIG. 3 is a block diagram showing a functional configuration of an encoding apparatus, specifically, a 2N-B/(N+1)-Q encoder, for multi-level signaling according to an embodiment of the present invention. The encoding apparatus includes a candidate pattern generator 1, a controller 2, and a data selector 3.

The candidate pattern generator 1 generates a set of candidate patterns from the input data by using symbol-based inversion, and provides the generated set of candidate patterns to the controller 2 and the data selector 3. For example, the candidate pattern generator 1 that receives 2N-B parallel data input performs inversion on symbols at different locations and generates four output candidate patterns.

The data selector 3 selects one candidate pattern from the set of the candidate patterns as data to be transmitted, by using a transmission control code that is determined and provided by the controller 2. The data selector 3 combines the selected candidate pattern and the transmission control code and outputs 2(N+1)-B data, that is, (N+1)-Q data.

The controller 2 includes a transition counter 21, a disparity calculator 22, a control code decision logic 23, a disparity accumulator 24, and a cumulated disparity selector 25.

The controller 2 generates the transmission control code, and provides the transmission control code to the data selector 3. To this end, the controller 2 determines the transmission control code by using a set of disparity values, a cumulated disparity value, a set of transition counts, and the like. The set of disparity values is a result of calculating disparity that indicates a degree to which each of the four candidate patterns deviates from DC balance. The cumulated disparity value is a result of calculating disparity that indicates a degree to which transmission data up to the previous transmission deviates from DC balance, and is stored inside the controller 2 for use. The set of transition counts is a result of calculating the number of times that a symbol-based zero-crossing transition is performed, for each of the candidate patterns, and details will be described later.

The output pattern finally selected by the data selector 3 is determined depending on a control symbol to be added, specifically, what value the transmission control code is set to. The value of Q of the control symbol also have four levels, which are +3, +1, −1, and −3, so that it is possible to perform mapping on each of the four output candidate patterns. The determined transmission control code is transmitted using one symbol. The number of the candidate patterns in the set is the same as the number of levels that one symbol has.

Therefore, it is important what basis is used to determine the control symbol value determining the characteristic of data encoding. In order to determine the basis, the disparity calculator 22, the transition counter 21, and the like are used. Herein, the disparity is a measure of how much DC balance of a PAM-4 output symbol deviates, and is calculated by using four values, which are +3, +1, −1, and −3, according to a Q-symbol level. Further, the transition refers to a transition corresponding to a PAM-4-based zero-crossing transition. Based on this, the disparity calculator 22 and the transition counter 21 calculate a disparity value and a transition count for each of the four candidate patterns, respectively, and transfer the results to the control code decision logic 23. The control code decision logic 23 determines the final output data pattern and the corresponding control symbol with which DC balancing is performed and, for example, transitions are maximized.

FIG. 4 to FIG. 8B show the detailed configuration of each block of the encoding apparatus shown in FIG. 3. For more clear description, the case of N=4, that is, 8-B/5-Q will be described below as an example (the present invention has scalability for an input data length and is not limited to 8-B/5-Q encoding).

Figure 4:
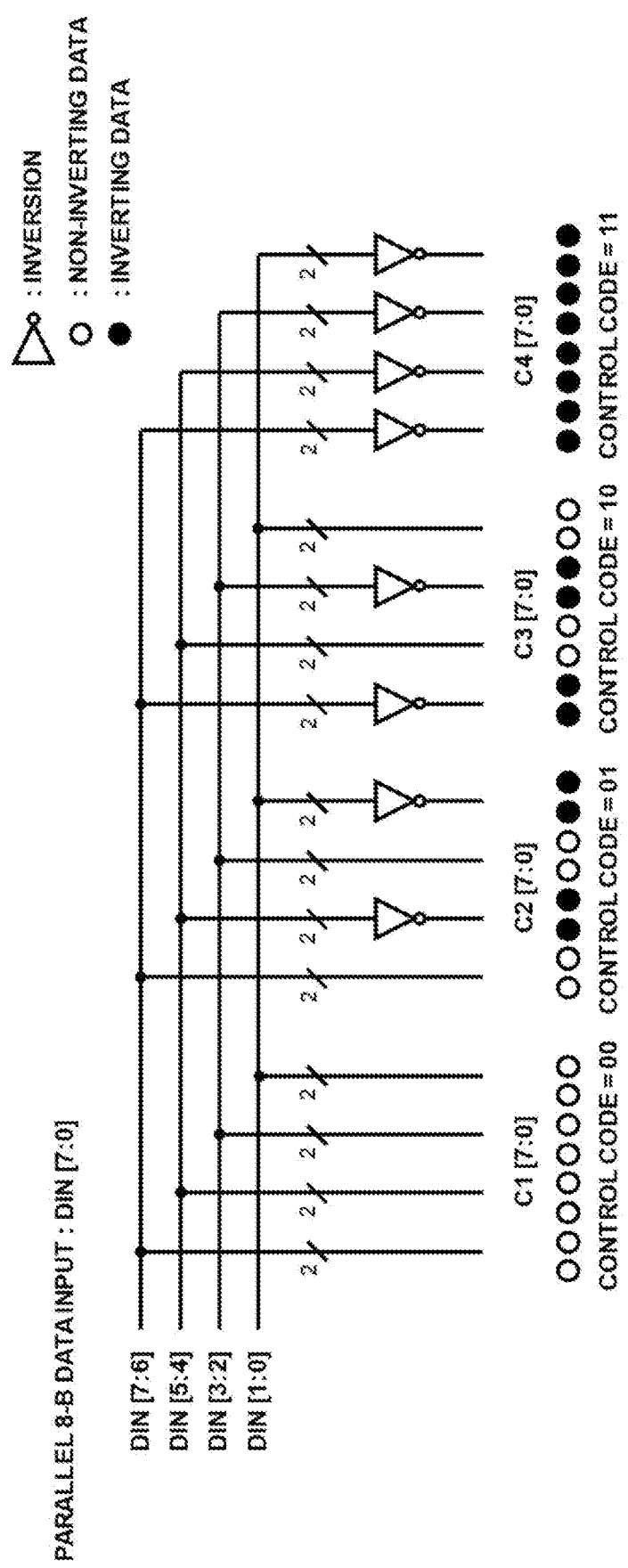
FIG. 4 is a conceptual diagram of a candidate pattern generator.

FIG. 4 is a conceptual diagram of a candidate pattern generator in an encoding apparatus according to an embodiment of the present invention. The candidate pattern generator 1 generates the four candidate patterns including: a first pattern c1 obtained by not inverting the input data at all; a second pattern c2 obtained by partially inverting the input data; a third pattern c3 obtained by partially inverting the input data, the third pattern c3 being in a complementary relationship with the second pattern; and a fourth pattern c4 obtained by inverting all the input data.

Parallel 8-B data input DIN [7:0] corresponds to the four Q-symbols. Depending on which location's Q-symbol is inverted on a per-symbol basis, four types of output candidate patterns C1 [7:0] to C4 [7:0] are generated. The inversion on a per-symbol basis may be inversion of each bit of 2-B corresponding to one symbol.

In the case of C1 [7:0], DIN [7:0] is output as it is without inversion. In the case of C2 [7:0], bits corresponding to DIN [5:4] and DIN [1:0] are inverted for output. In the case of C3 [7:0], bits corresponding to DIN [7:6] and DIN [3:2] are inverted for output. In the case of C4 [7:0], all the DIN [7:0] is inverted for output. As described above, data is divided on a per-2-bit basis and bit-wise inversion is performed on a per-Q-symbol basis of PAM-4. Therefore, for example, the symbol value of +3 turns into the symbol value of −3 after bit-wise inversion, and the symbol value of −1 turns into the symbol value of +1 after bit-wise inversion.

Among these, the finally output data pattern value is determined by the control code decision logic. When the value of CONTROL CODE [1:0] is 00, C1 [7:0] is selected. When the value is 01, C2 [7:0] is selected. When the value is 10, C3 [7:0] is selected. When the value is 11, C4 [7:0] is selected. Then, CONTROL CODE [1:0] (namely, the transmission control code) is added to the selected data pattern as the last Q-symbol value. Finally, 10-bit (corresponding to 5-Q) data is output. Accordingly, in a receiver chip, through the Q-symbol value corresponding to the transmission control code, it is possible to determine which location's bit (symbol) in the data pattern is inverted, and to perform decoding.

FIG. 5A is a conceptual diagram of the disparity calculator and the transition counter.

The disparity calculator 22 receives the set of candidate patterns C1, C2, C3, and C4 and outputs the set of disparity values DS1, DS2, DS3, and DS4 that are results of calculating disparity indicating the degree to which each of the candidate patterns deviates from DC balance. The transition counter 21 receives the set of candidate patterns C1, C2, C3, and C4, calculates the number of times that the symbol-based zero-crossing transition is performed, for each of the candidate patterns, and outputs the result of calculation as the set of transition counts T1, T2, T3, and T4. Input and output data may be sequentially input and output as shown in the drawing, or may be input and output in parallel. Together with Cx [7:0] (herein, x=1, 2, 3, 4) generated in the candidate pattern generator 1, the value of CONTROL CODE [1:0] corresponding to each of Cx [7:0] is received as input or is self-generated, so that the disparity values and the transition counts corresponding to Cx [7:0] pattern are calculated and output.

The disparity calculator 22 calculates the sum of each of the candidate patterns and the corresponding control code 2 bits by 2 bits corresponding to the symbol, wherein 1:1 mapping into the symbol level value is performed 2 bits by 2 bits and the sum of the mapped symbol level values is calculated, thereby calculating the disparity values. For example, bit strings 11, 10, 01, and 00 are allocated to +3, +1, −1, and −3, which correspond to Q-symbol levels, respectively.

For example, when the value of C1 [7:0] is 10011101, the sum of values of C1 [7:6], C1 [5:4], C1[3:2], C1[1:0], and CONTROL CODE [1:0] is calculated. Herein, allocation to the values corresponding to the Q-symbol levels takes place, so that (+1)+(−1)+(+3)+(−1)+(−3)=−1 is calculated, resulting the disparity value. This value is output as DS1 [4:0]=11111, including the sign.

The transition counter 21 receives the set of candidate patterns C1, C2, C3, and C4, performs XOR operation on the MSBs of neighboring bit strings among the bit strings (2 bits each) corresponding to the respective symbols, with respect to each of the candidate patterns and the corresponding control code, and calculates the sum of results of XOR, thereby calculating the transition counts.

In the case of x=1, the zero-crossing transition of PAM-4 may be acquired by performing XOR operation on C1 [7], C1 [5], C1 [3], C1 [1], and CONTROL CODE [1] that correspond to the MSBs at the respective symbol locations. That is, (C1 [7]^C1 [5])+(C1 [5]^C1 [3])+(C1 [3]^C1 [1])+(C1 [1]^CC [1])=3 is calculated, and this value is output as T1 [2:0]=011 in an unsigned form (herein, the symbol ^ denotes XOR operation, and CC is short for CONTROL CODE).

For C2 [7:0] corresponding to the case of x=2, the same operation as above is performed, so that DS2 [4:0] and T2 [2:0] are output. In the same manner as the above example, in the case of C1 [7:0]=10011101, C2 [7:0]=10101110 is acquired, resulting DS2 [4:0]=(+1)+(+1)+(+3)+(+1)+(−1)=+5. Therefore, DS2 [4:0]=00101, and T2 [2:0]=001 are acquired.

For C3 [7:0] and C4 [7:0] corresponding to the remaining cases of x=3, 4, the same operation as above may be performed. However, referring to the data values of C1 [7:0] to C4 [7:0] in FIG. 4, it is found that C4 [7:0] is the result of inversion of all bits of C1 [7:0] and C3 [7:0] is the result of inversion of all bits of C2 [7:0]. Therefore, the values of DS4 [4:0] and DS3 [4:0] are +1, and −5, respectively, through 2's complement of the values of DS1 [4:0] and DS2 [4:0], respectively. The values of T4 [2:0] and T3 [2:0] are 011 (+3), and 001 (+1), respectively, which are the same as those of T1 [2:0] and T2 [2:0], respectively.

Due to this characteristic, the parts of the disparity calculator and the transition counter corresponding to x=3, 4 may be omitted greatly, so that the system may be configured to be more compact.

Figure 5B:
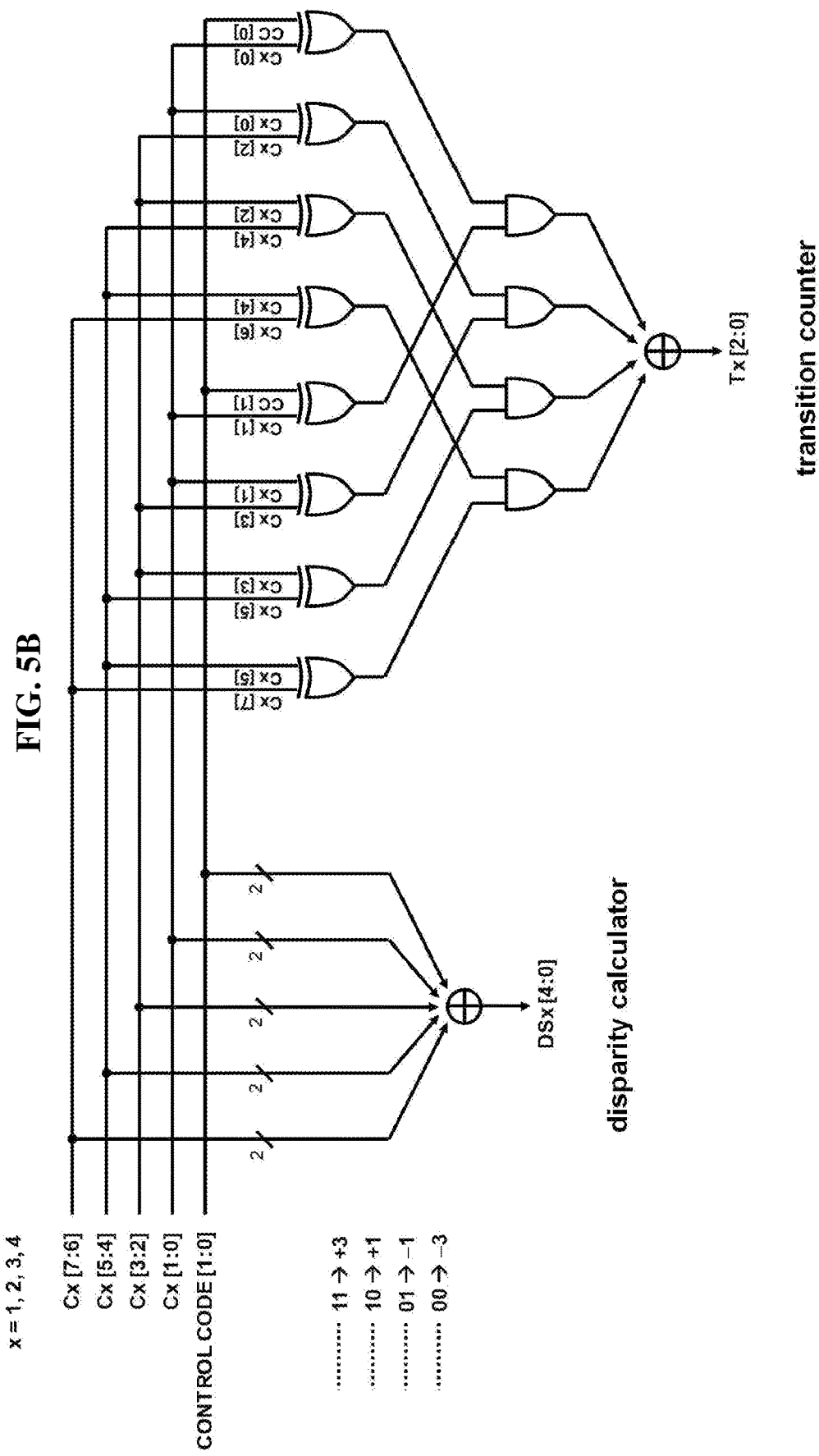

Depending on the configuration of an application and receiver hardware, the type of transition to count may vary. FIG. 5A shows an example of the case of counting and maximizing zero-crossing transitions, but alternative methods may be selected: FIG. 5B shows the case where a simple logic gate is added to count symmetric zero-crossing (e.g. +3→−3, −1→+1); and FIG. 5C shows the case all transitions of PAM-4 are counted regardless of zero-crossing.

Figure 6:
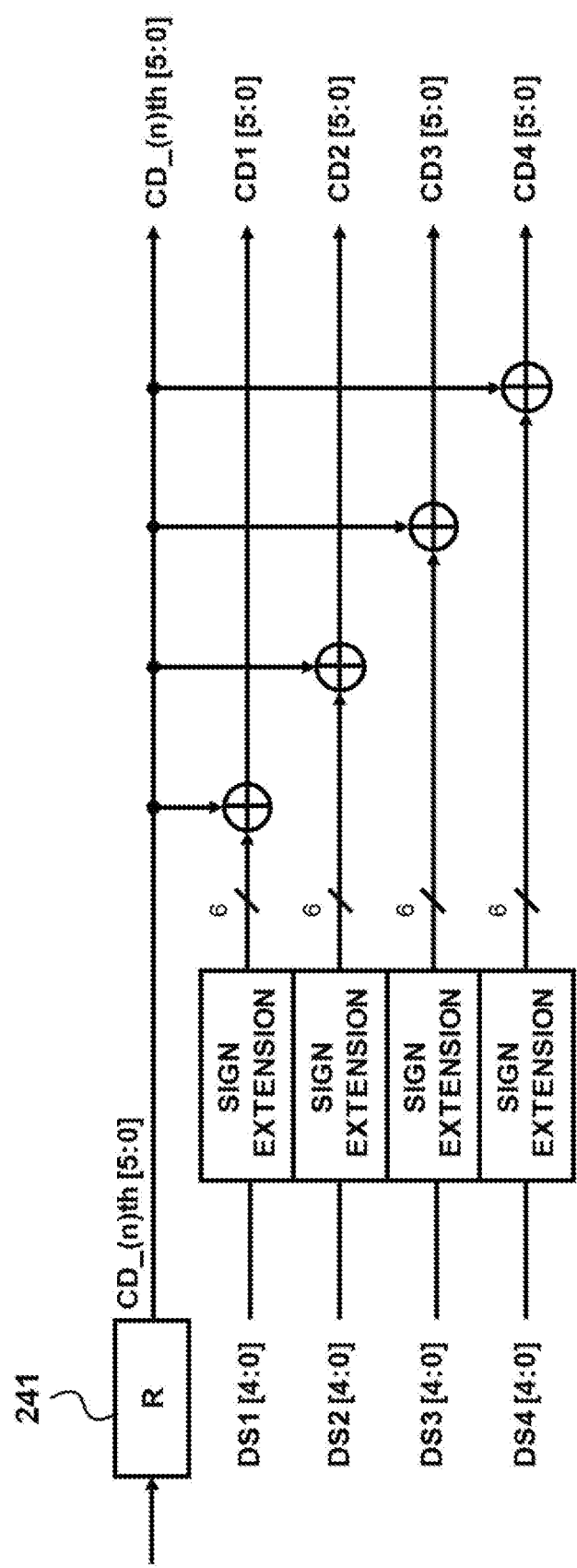
FIG. 6 is a conceptual diagram of a disparity accumulator.

FIG. 6 is a conceptual diagram of the disparity accumulator. The disparity accumulator 24 includes a register 241 storing the cumulated disparity value. The register 241 updates and stores the cumulated disparity value. The cumulated disparity value stored in the register 241 is provided to the control code decision logic 23 and is then used for determination of the transmission control code. The cumulated disparity value selected by the cumulated disparity selector 25 is stored back to the register 241 and is then used for determination of the subsequent transmission control code. The disparity accumulator 24 stores a result of calculating the sum of the cumulated disparity value and the disparity value according to the determined transmission control code, in the register 241 as the subsequent cumulated disparity value.

Figure 5C:
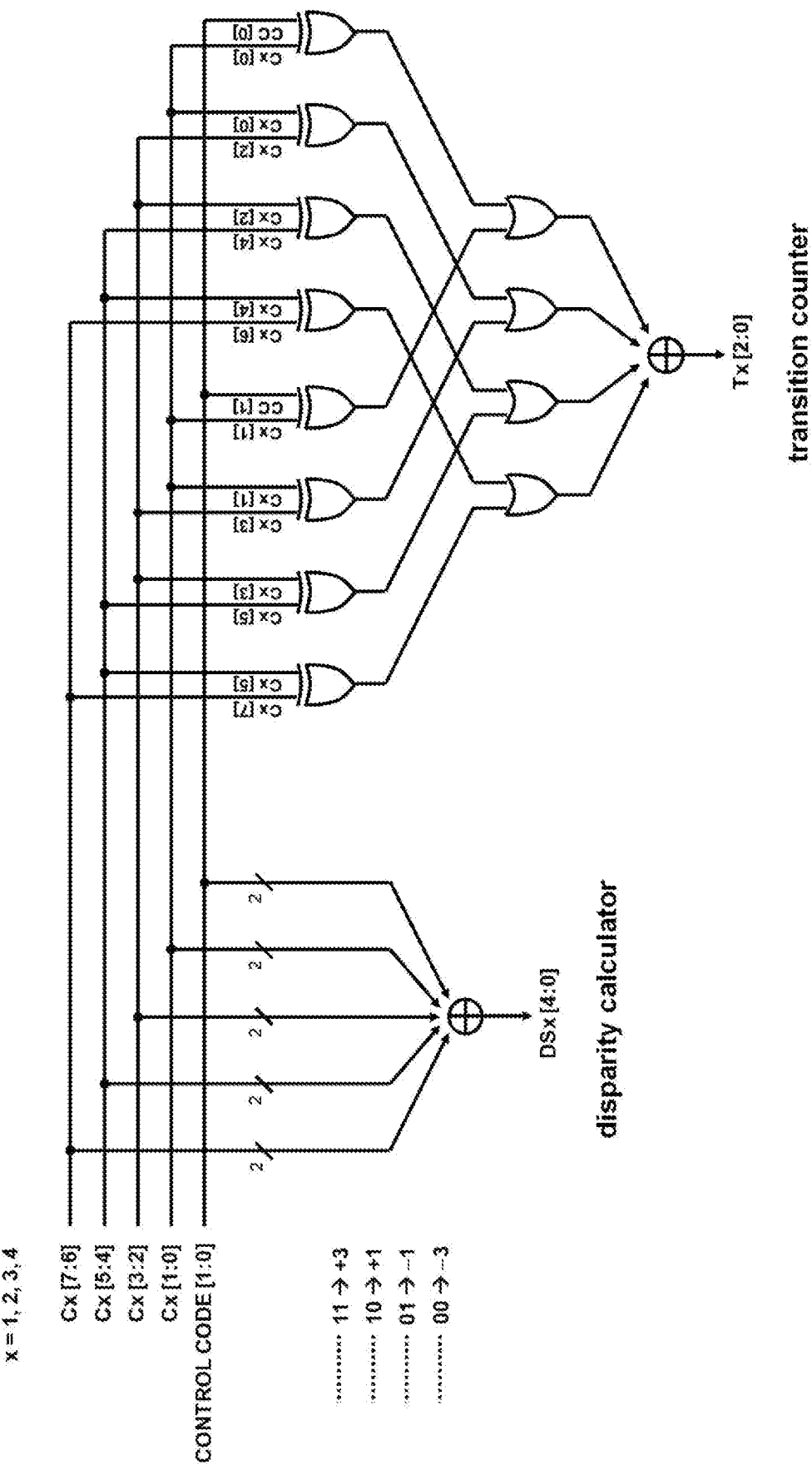

The value of DSx [4:0] output from the disparity calculator 22 of FIGS. 5A to 5C described above and CD_(n)th [5:0] that is the cumulated disparity value previously accumulated are received as input. The DSx [4:0] is subjected to sign extension and is then subjected to summation with CD_(n)th [5:0], so that CDx [5:0] is output. Afterward, when the transmission control code is determined, the cumulated disparity selector 25 selects one value of CDx [5:0]. The selected value is used as the cumulated disparity value CD_(n+1)th [5:0] for the subsequent 2N-B DATA INPUT, whereby the disparity value is continually accumulated.

FIG. 7 is a conceptual diagram of the control code decision logic.

The control code decision logic 23 of the controller 2 determines and outputs one transmission control code CC among the four control codes, by using a result of comparing the set of disparity values DS1, DS2, DS3, and DS4 output from the disparity calculator 22 with the cumulated disparity value CD_(n)th output from the register 241, and using the set of transition counts T1, T2, T3, and T4 output from the transition counter 21.

More specifically, a compare logic 1 231 of the control code decision logic 23 selects two candidates by comparing the sign bit (MSB) CD_(n)th[5] in the cumulated disparity value with each sign bit (MSB) in the set of disparity values. A compare logic 2 232 of the control code decision logic 23 selects two candidates with which transitions are maximized in the set of transition counts, and then determines the control code corresponding to the common candidate as the transmission control code.

(Herein, depending on the application and high speed link environment, the transition counter and a control code decision logic related thereto may be configured in a form other than the above description. For example, in order to improve the CDR characteristic of the receiver chip, it is possible to change a standard of the transition to a symmetric zero-crossing transition, or in order to improve the EMI characteristic, it is possible to change the transition count into a form of data for minimization not maximization.)

The control code decision logic 23 receives the following, as input: CD_(n)th [5] corresponding to the sign bit from CD_(n)th[5:0] that is the cumulated disparity value previously accumulated; DSx[4] corresponding to the sign bit from DSx[4:0] which is output of the disparity calculator 22; and Tx[2:0] which is output of the transition counter 21.

First, by comparing the sign value of CD_(n)th and the sign value of DSx, two candidates for DC balancing are selected. For example, assuming that the sign value of CD_(n)th is 0 (plus) and the values of DSx [4:0] are DS1 [4:0]=11111 (−1), DS2 [4:0]=00101 (+5), DS3=11011 (−5), and DS4=00001 (+1) as described with reference to FIGS. 5A to 5C, DS1 [4]=1 (minus), DS2 [4]=0 (plus), DS3 [4]=1 (minus), and DS4 [4]=0 (plus) are received as input. Since the sign value of CD_(n)th, which is the cumulated disparity value previously accumulated, is 0 (plus), it is found that in order to satisfy Eq. 1 of PAM-4 DC balancing, data having the sign value of 1 (minus) needs to be selected from the current candidate data. Therefore, x=1, 3 are selected as the two candidates for DC balancing.

Next, two candidates for transition maximization are selected through comparison of Tx [2:0]. For example, when using the values of Tx [2:0] that are T1 [2:0]=011 (+3), T2 [2:0]=001 (+1), T3 [2:0]=001 (+1), and T4 [2:0]=011 (+3) described with reference to FIGS. 5A to 5C, it is found that for transition maximization, x=1, 4 need to be selected as two candidates from the candidate data.

Among the two candidates selected for each of DC balancing and transition maximization, x=1 that satisfies both conditions is data to be finally output, and the control code (that is, the transmission control code) for selecting this is determined as 00, in this example. For reference, due to the characteristics of DS4 [4:0]=~DS1 [4:0]+1, DS3 [4:0]=~DS2 [4:0]+1, T4 [2:0]=T1 [2:0], and T3 [2:0]=T2 [2:0] described with reference to FIGS. 5A to 5C, the result of the control code decision logic 23 basically converges to one x value (herein, the symbol ~ denotes bit-wise inversion). However, in order to eliminate an ambiguous state when implementing an actual logic, in the case of T1 [2:0]=T2 [2:0]=T3 [2:0]=T4 [2:0], it is needed to define which value to select. It is preferred to select x=2, 3 as candidates. This is because in the case of x=1, 2, 3, 4, control code=00 (−3), 01 (−1), 10 (+1), 11 (+3) is determined and selecting a value close to 0, as the transmission control code, is advantageous in terms of DC balancing.

Figure 8A:
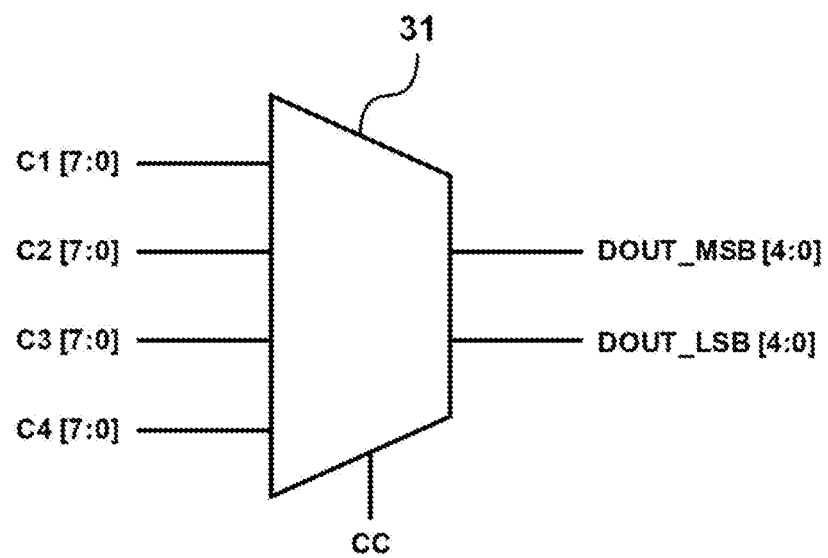
FIGS. 8A and 8B are conceptual diagrams of a data selector and a cumulated disparity selector, respectively.
Figure 8B:
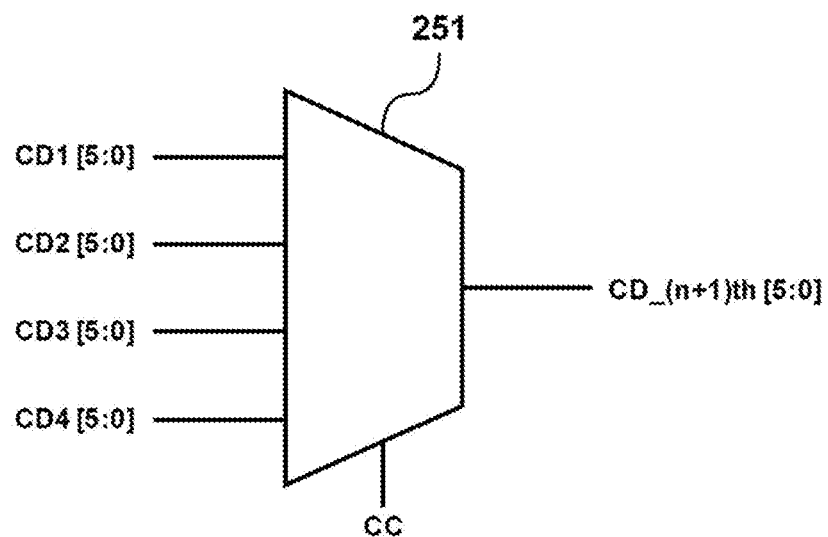

FIG. 8A shows a conceptual diagram of the data selector and FIG. 8B shows a conceptual diagram of the cumulated disparity selector.

According to the transmission control code CC determined through the control code decision logic of FIG. 7, one of Cx [7:0] is selected using a selector 1 31, and one of CDx [5:0] is selected using a selector 2 251. The data to be output is mapped to DOUT_MSB [4:0] and DOUT_LSB [4:0] for output on a per-Q-symbol basis. Herein, Cx [7] and Cx [6] are mapped to DOUT_MSB [4] and DOUT_LSB [4], respectively, and the remaining Cx [5:0] are mapped in the same manner. Lastly, CONTROL CODE [1] and CONTROL CODE [0] are mapped to DOUT_MSB [0] and DOUT_LSB [0] for output (herein, the order of outputting data, such as MSB first, and LSB first out, is determined by mapping, but this may be arbitrarily set in addition to the example). Regarding the cumulated disparity value, the value of CDx [5:0] selected by the x value is updated with CD_(n+1)th [5:0] and is stored in the register, and is fed back as input of the disparity accumulator and the control code decision logic in the subsequent data operation.

Figure 9A:
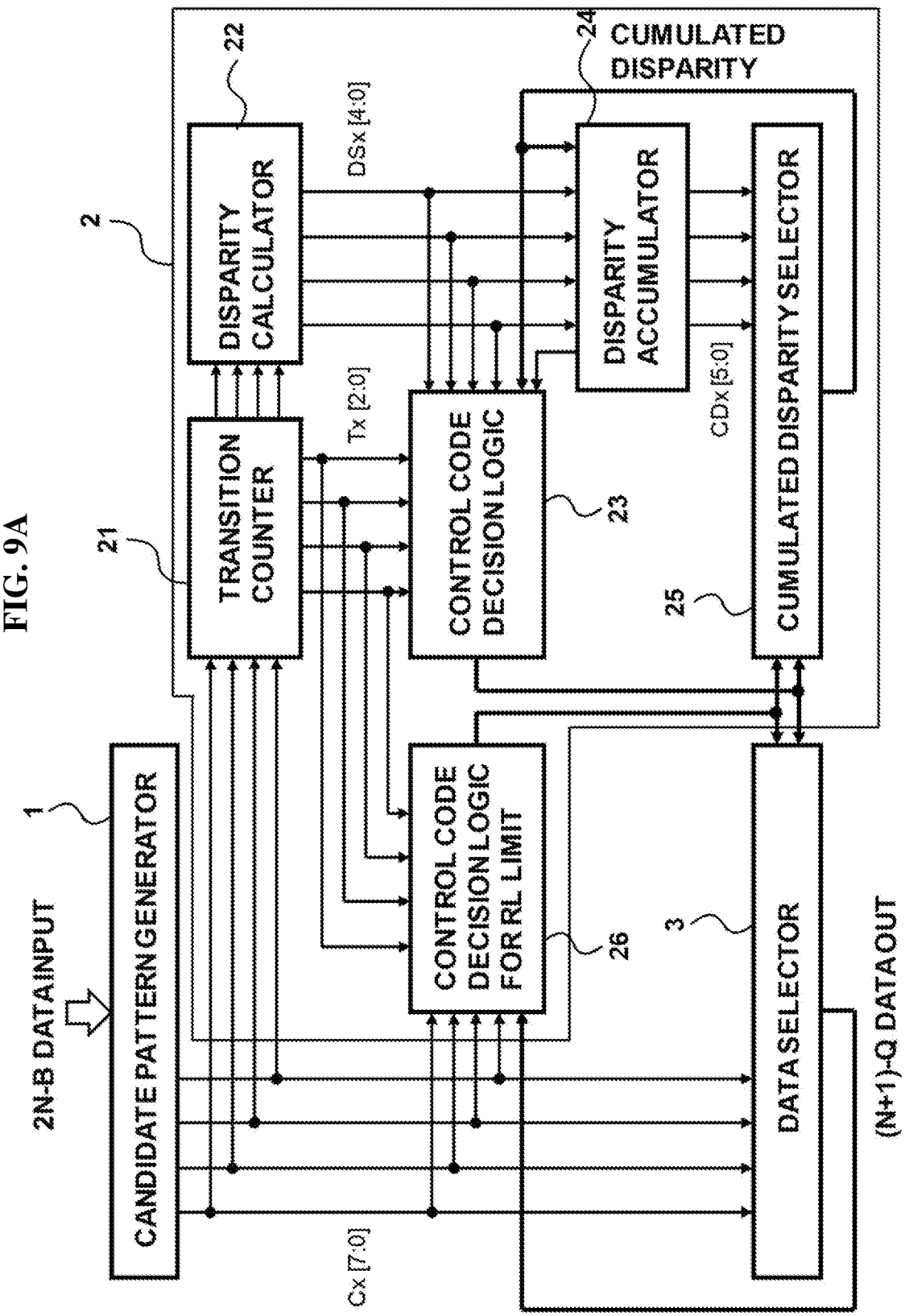
Figure 9C:
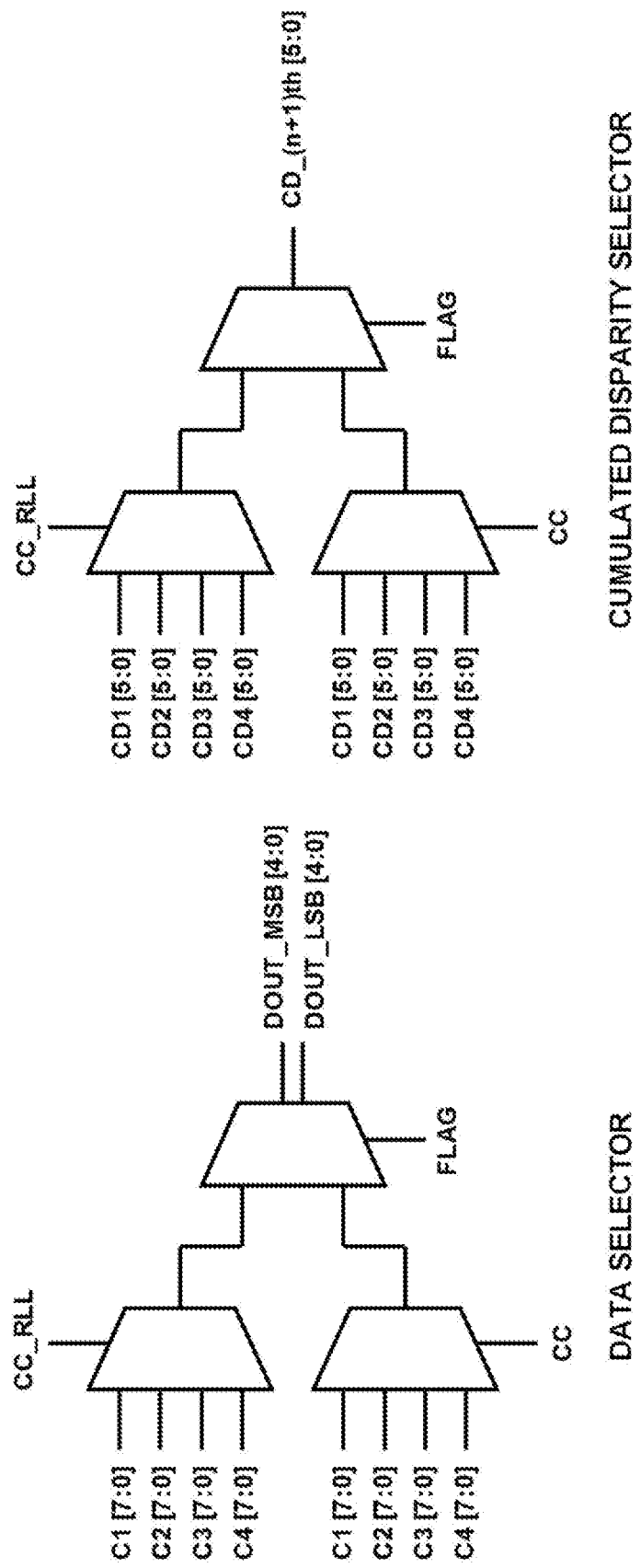

FIGS. 9A to 9C are diagrams showing another embodiment of the encoder with run-length limit (RLL) encoding. FIG. 9A is a block diagram showing the overall functional organization. FIG. 9B is a block diagram showing a control code decision logic for RLL. FIG. 9C is a block diagram of a data selector and a cumulated disparity selector.

Compared to the embodiment of FIG. 3, a control code decision logic for RLL 26 is added in the embodiment of FIGS. 9A to 9C. The controller 2 further includes the control code decision for RLL 26. The control code decision for RLL 26 uses the previous transmission data (N+1)-Q DATA OUT and the set of candidate patterns C1, C2, C3, and C4 to sense that the run length of a determined number or more is likely to occur. When sensing that the run length of the determined number of more is likely to occur, the control code decision for RLL 26 selects a candidate that enables the transition to occur in the first symbol.

As shown in FIG. 9B, the control code decision logic for RLL senses whether the run length that is likely to occur over two pieces of data which are needed to be transmitted continuously is, for example, 4 or more. When sensing this, a FLAG signal is generated and a transmission control code for RLL (CC_RLL) is determined so that this data pattern does not occur (herein, the length of the run length to be sensed may vary according to the input data length).

For example, a sensing & selection 261 identifies the value of the candidate pattern Cx [7:0] from the previously output (N+1)-Q data and the currently input data, and when sensing the pattern that is likely to have the run length of 4 or more, the sensing & selection 261 selects two candidate patterns that enable the transition to certainly occur in the first Q-symbol, and generates the FLAG signal. In the same manner as the case of FIG. 6, a compare logic 262 selects two candidate patterns enabling transition maximization. An AND logic 263 selects the common candidate and determines the same as the transmission control code for RLL (CC_RLL).

Afterward, as shown in FIG. 9C, when the FLAG signal is sensed, the data selector determines transmission data according to the CC_RLL and the cumulated disparity selector selects and outputs CDx corresponding to the CC_RLL. In contrast, when the FLAG signal is not sensed, the data and the cumulated disparity value are determined according to the existing transmission control code. In the case of adding a run length limit code, in addition to an actual data signal to be transmitted, an (out-of-bound) extra signal, such as K characters of Ref. 1, may be generated to help communication between the transmitter and the receiver. However, herein, there is likelihood that data is selected in a manner that does not temporarily maintain DC balance. Therefore, in order not to make this fact a problem, it is necessary to determine the run length value to be limited so that a run length limit flag is generated with a sufficiently low probability.

Figure 10:
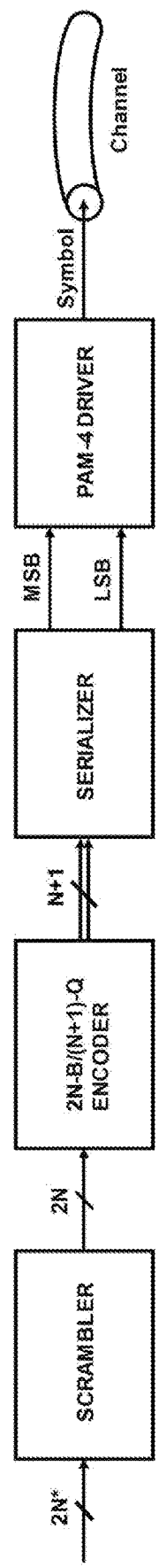
FIG. 10 is a block diagram of a transmitter with a scrambler.

FIG. 10 is a block diagram showing a case where a scrambler is added to the front end of the 2N-B/(N+1)-Q encoder. In an application such as camera or a display, there may be a pattern in which 0 or 1 repeats continuously in a dark or saturated image. When this data input comes in, the peak of the output spectrum of the encoder becomes high, resulting a problem, such as EMI, or the like. The scrambler generates a pseudo-random binary sequence and performs XOR operation with the input data, thereby reducing the peak of the output data spectrum. Accordingly, in this application, the configuration in which the scrambler is added to the previous stage of the encoder may be selected, as shown in FIG. 10.

The encoding apparatus has been described with reference to FIGS. 2 to 10, and in this description, the encoding method of the present invention has been described incidentally. Hereinafter, the encoding method of the present invention will be briefly described, and parts overlapping with the description of the encoding apparatus may be omitted.

The encoding method for multi-level signaling according to the present invention is executed in the transmitter, and may be executed in three steps, roughly. A first step is to, by the candidate pattern generator 1, generate the set of candidate patterns from input data by using symbol-based inversion. A second step is to, by the controller 2, determine the transmission control code by using the set of disparity values, which is a result of calculating disparity that indicates the degree to which each of the candidate patterns deviates from DC balance, a cumulated disparity value previously stored, and the like. A third step is to, by the data selector 3, select one candidate pattern from the set of candidate patterns as data to be transmitted, by using the determined transmission control code. These steps are not necessarily separated with one or more clock periods therebetween. These steps may be executed in an instant by a combinational logic, wherein the latter step may be executed in a manner that uses a valid output of the former step.

The third step includes two independent processes: generating, by the disparity calculator 22, the set of the disparity values that is the result of calculating disparity indicating the degree to which each of the candidate patterns deviates from DC balance; and generating, by the transition counter 21, as a set of transition counts, a result of calculating the number of times that a symbol-based transition is performed, for each of the candidate patterns. The two processes may be executed in series or in parallel. By using the set of transition counts and a result of comparing the set of disparity values with the cumulated disparity value, the transmission control code is determined.

The encoding method according to the present invention is executed in the encoding apparatus having the structure shown in FIG. 2 to FIG. 10, but may also be implemented in an apparatus having various structures in the same manner.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An encoding apparatus for multi-level signaling, the encoding apparatus comprising:
   a candidate pattern generator (1) generating a set of candidate patterns from input data by using symbol-based inversion;
   a controller (2) generating a cumulated disparity value that is a result of calculating disparity indicating a degree to which transmission data up to previous transmission deviates from DC balance, storing the cumulated disparity value, and determining a transmission control code by using the cumulated disparity value and a set of disparity values that is a result of calculating disparity indicating a degree to which each of the candidate patterns deviates from DC balance; and
   a data selector (3) selecting one candidate pattern from the set of the candidate patterns as data to be transmitted, according to the determined transmission control code.

2. The encoding apparatus of claim 1, wherein the candidate pattern generator (1) generates four candidate patterns including: a first pattern obtained by not inverting the input data at all; a second pattern obtained by partially inverting the input data; a third pattern obtained by partially inverting the input data, the third pattern being in a complementary relationship with the second pattern; and a fourth pattern obtained by inverting all the input data.

3. The encoding apparatus of claim 1, wherein the determined transmission control code is transmitted using one symbol, and
   the number of the candidate patterns in the set is the same as the number of levels that one symbol has.

4. The encoding apparatus of claim 3, wherein the transmission data having (N+1) Q-symbols is output with respect to the input data having arbitrary 2N bits (N is a natural number of 2 or more).

5. The encoding apparatus of claim 1, wherein the controller (2) comprises:
   a disparity calculator (22) outputting the set of the disparity values that is the result of calculating disparity indicating the degree to which each of the candidate patterns deviates from DC balance; and
   a transition counter (21) outputting, as a set of transition counts, a result of calculating the number of times that a symbol-based transition is performed, for each of the candidate patterns.

6. The encoding apparatus of claim 5, wherein the controller (2) further comprises:
   a control code decision logic (23) determining the transmission control code by using the set of the transition counts and a result of comparing the set of the disparity values with the cumulated disparity value.

7. The encoding apparatus of claim 6, wherein the set of the candidate patterns includes four candidate patterns, and
   the control code decision logic (23) selects two candidates by comparing a sign bit in the cumulated disparity value with each sign bit in the set of the disparity values, selects two candidates that are the maximum transition counts in the set, and then determines a control code corresponding to the common candidate as the transmission control code.

8. The encoding apparatus of claim 5, wherein the controller (2) further comprises:
   a control code decision for RLL (26) uses the previous transmission data and the set of the candidate patterns to sense that a run length of a determined number or more is likely to occur, and selects, when sensing that the run length of the determined number or more is likely to occur, the candidate that enables the transition to occur in the first symbol.

9. The encoding apparatus of claim 5, wherein the disparity calculator (22) calculates a sum of all bit strings corresponding to symbols with respect to each of the candidate patterns and a corresponding control code, wherein the bit strings are subjected to 1:1 mapping into symbol level values and a sum of the mapped symbol level values is calculated, thereby calculating the disparity values.

10. The encoding apparatus of claim 5, wherein when the transition counter (21) calculates the number of times that the symbol-based transition is performed, the transition counter (21) counts all zero-crossing transitions, symmetric zero-crossing, or all transitions regardless of zero-crossing.

11. The encoding apparatus of claim 5, wherein the controller (2) further comprises:
    a disparity accumulator (24) including a register (241) that stores the cumulated disparity value, and storing a result of calculating a sum of the cumulated disparity value and the disparity value according to the determined transmission control code, in the register 241 as the subsequent cumulated disparity value.

12. An encoding method for multi-level signaling, wherein the encoding method is executed in a transmitter, the encoding method comprising:

generating, at a first step, a set of candidate patterns from input data by using symbol-based inversion;

determining, at a second step, a transmission control code by using a cumulated disparity value previously stored and a set of disparity values that is a result of calculating disparity indicating a degree to which each of the candidate patterns deviates from DC balance; and selecting, at a third step, one candidate pattern from the set of the candidate patterns as data to be transmitted, according to the determined transmission control code, wherein the cumulated disparity value is a result of accumulating disparity indicating a degree to which transmission data up to previous transmission deviates from DC balance.

13. The encoding method of claim 12, wherein the set of the candidate patterns includes: a first pattern obtained by not inverting the input data at all; a second pattern obtained by partially inverting the input data; a third pattern obtained by partially inverting the input data, the third pattern being in a complementary relationship with the second pattern; and a fourth pattern obtained by inverting all the input data.

14. The encoding method of claim 12, wherein the determined transmission control code is transmitted using one symbol, and the number of the candidate patterns in the set is the same as the number of levels that one symbol has.

15. The encoding method of claim 12, wherein the third step comprises:

generating the set of the disparity values that is the result of calculating disparity indicating the degree to which each of the candidate patterns deviates from DC balance; and generating, as a set of transition counts, a result of calculating the number of times that a symbol-based transition is performed, for each of the candidate patterns.

16. The encoding method of claim 15, wherein the third step further comprises:

determining the transmission control code by using the set of the transition counts and a result of comparing the set of the disparity values and the cumulated disparity value.

17. The encoding method of claim 16, wherein the set of the candidate patterns includes four candidate patterns, and two candidates are selected by comparing a sign bit in the cumulated disparity value with each sign bit in the set of the disparity values, two candidates that are the maximum transition counts in the set are selected, and then a control code corresponding to the common candidate is determined as the transmission control code.

18. The encoding method of claim 15, wherein at the generating of the set of the disparity values, a sum of all bit strings corresponding to symbols is calculated with respect to each of the candidate patterns and a corresponding control code, wherein the bit strings are subjected to 1:1 mapping into symbol level values and a sum of the mapped symbol level values is calculated, thereby calculating the disparity values.

19. The encoding method of claim 15, wherein at the generating the result of calculation as the set of the transition counts, all zero-crossing transitions are counted, symmetric zero-crossing are counted, or all transitions regardless of zero-crossing are counted.

20. The encoding method of claim 15, wherein a register (241) storing the cumulated disparity value is provided, and a result of calculating a sum of the cumulated disparity value and the disparity value according to the determined transmission control code is stored in the register (241) as the subsequent cumulated disparity value.

21. An encoding method for multi-level signaling, wherein the encoding method is executed in a transmitter, the encoding method comprising:

generating, from input data, a set of candidate patterns including a first pattern obtained by not inverting the input data at all, a second pattern obtained by partially inverting the input data, a third pattern obtained by partially inverting the input data, the third pattern being in a complementary relationship with the second pattern, and a fourth pattern obtained by inverting all the input data; and selecting one pattern among the first pattern to the fourth pattern as data to be transmitted, by using a cumulated disparity value previously stored and a set of disparity values that is a result of calculating disparity indicating a degree to which each of the first pattern to the fourth pattern deviates from DC balance, wherein the cumulated disparity value is a result of accumulating disparity indicating a degree to which transmission data up to previous transmission deviates from DC balance.

* * * * *